(12) United States Patent
Hong

(10) Patent No.: US 9,575,839 B2
(45) Date of Patent: Feb. 21, 2017

(54) DATA STORAGE DEVICE AND OPERATING METHOD THEREOF

(71) Applicant: SK hynix Inc., Gyeonggi-do (KR)

(72) Inventor: Ji Man Hong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 55 days.

(21) Appl. No.: 14/638,673

(22) Filed: Mar. 4, 2015

(65) Prior Publication Data
US 2016/0179625 A1 Jun. 23, 2016

(30) Foreign Application Priority Data

Dec. 18, 2014 (KR) .................. 10-2014-0183308

(51) Int. Cl.
| | |
|---|---|
| G06F 11/14 | (2006.01) |
| G06F 12/02 | (2006.01) |
| G11C 11/56 | (2006.01) |
| G11C 29/04 | (2006.01) |

(52) U.S. Cl.
CPC ....... *G06F 11/1435* (2013.01); *G06F 12/0246* (2013.01); *G11C 11/5628* (2013.01); *G06F 2212/7201* (2013.01); *G11C 2029/0411* (2013.01)

(58) Field of Classification Search
CPC .............. G06F 11/1451; G06F 11/1435; G06F 12/0246; G06F 2201/84; G06F 2212/7201
See application file for complete search history.

(56) References Cited

U.S. PATENT DOCUMENTS

| | | | | |
|---|---|---|---|---|
| 7,990,765 B2* | 8/2011 | Park | ..................... | G11C 11/5628 365/185.03 |
| 8,031,522 B2* | 10/2011 | Jang | ..................... | G11C 11/5628 365/185.03 |
| 8,588,003 B1* | 11/2013 | Weingarten | ......... | G11C 11/5628 365/185.02 |
| 9,007,841 B1* | 4/2015 | Li | .......................... | G11C 16/10 365/185.03 |
| 2005/0193161 A1* | 9/2005 | Lee | ..................... | G06F 12/0246 711/103 |
| 2012/0170365 A1* | 7/2012 | Kang | .................. | G11C 16/0483 365/185.03 |
| 2013/0304966 A1* | 11/2013 | Joo | ..................... | G06F 12/0246 711/103 |
| 2013/0311711 A1* | 11/2013 | Yang | .................. | G06F 12/0246 711/103 |

(Continued)

FOREIGN PATENT DOCUMENTS

KR  1020130128694  11/2013

OTHER PUBLICATIONS

J. Lee and D. Shin, "Adaptive Paired Page Prebackup Scheme for MLC NAND Flash Memory," in IEEE Transactions on Computer-Aided Design of Integrated Circuits and Systems, vol. 33, No. 7, pp. 1110-1114, Jul. 2014.*

*Primary Examiner* — David X Yi
*Assistant Examiner* — Ramon A Mercado
(74) *Attorney, Agent, or Firm* — IP & T Group LLP

(57) ABSTRACT

A data storage device includes a nonvolatile memory apparatus including a memory block including a plurality of pages; and a processor suitable for writing write data in target pages of the memory block, and backing up special management data of the write data in at least one backup page of the memory block.

12 Claims, 20 Drawing Sheets

(56) References Cited

U.S. PATENT DOCUMENTS

| | | | | |
|---|---|---|---|---|
| 2015/0103599 A1* | 4/2015 | Kim | ..................... | G11C 16/26 |
| | | | | 365/185.12 |
| 2016/0041788 A1* | 2/2016 | Lee | ..................... | G06F 3/0634 |
| | | | | 711/170 |

* cited by examiner

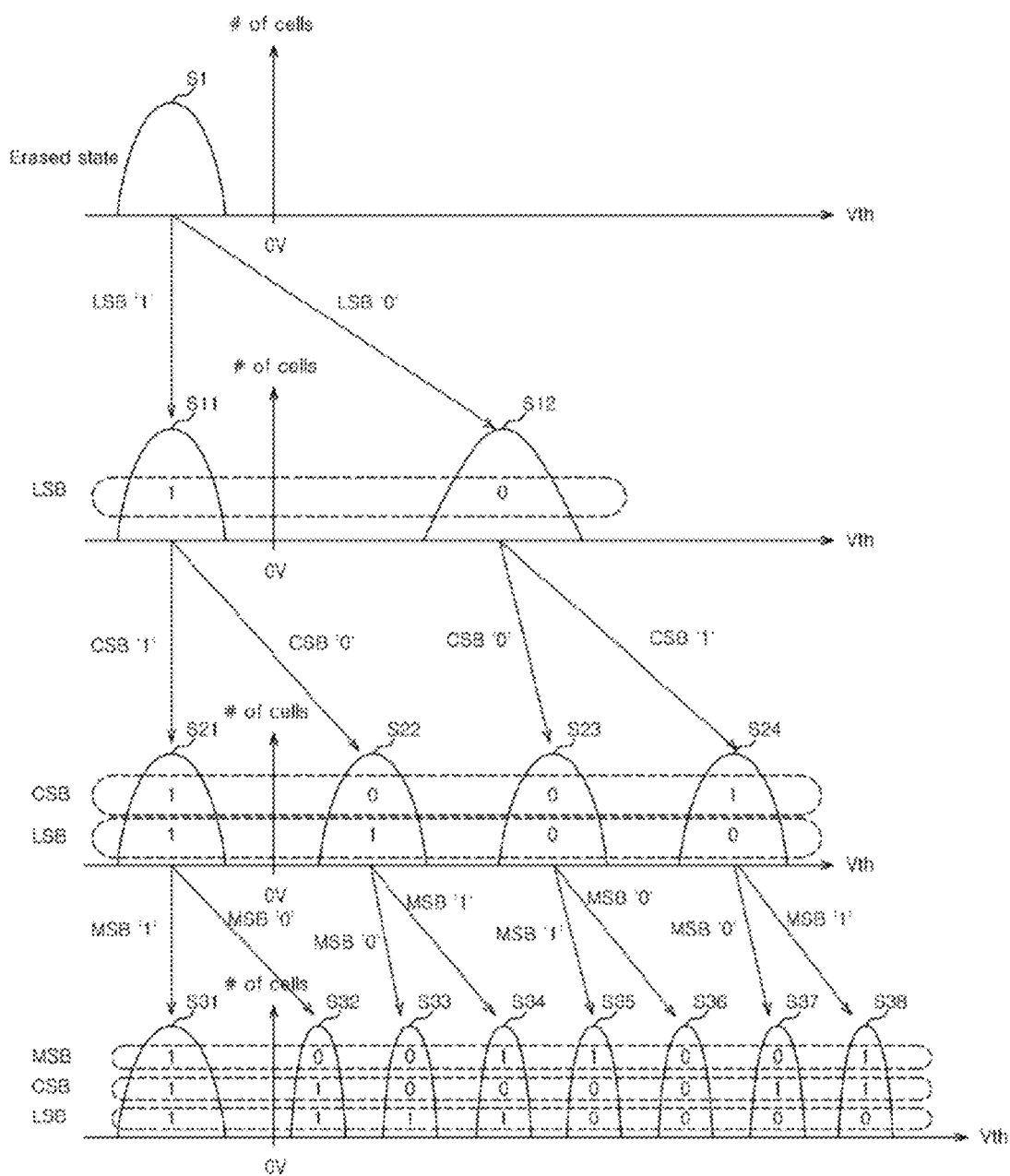

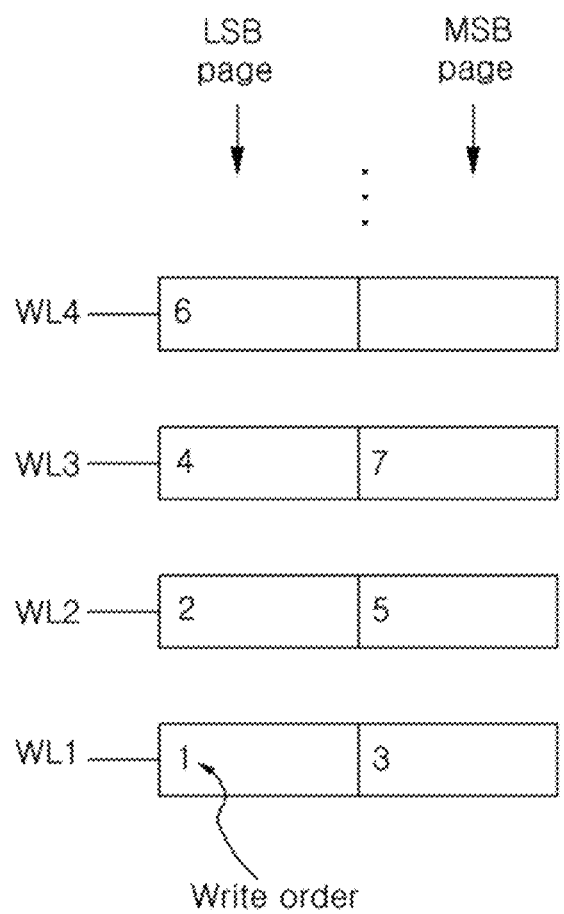

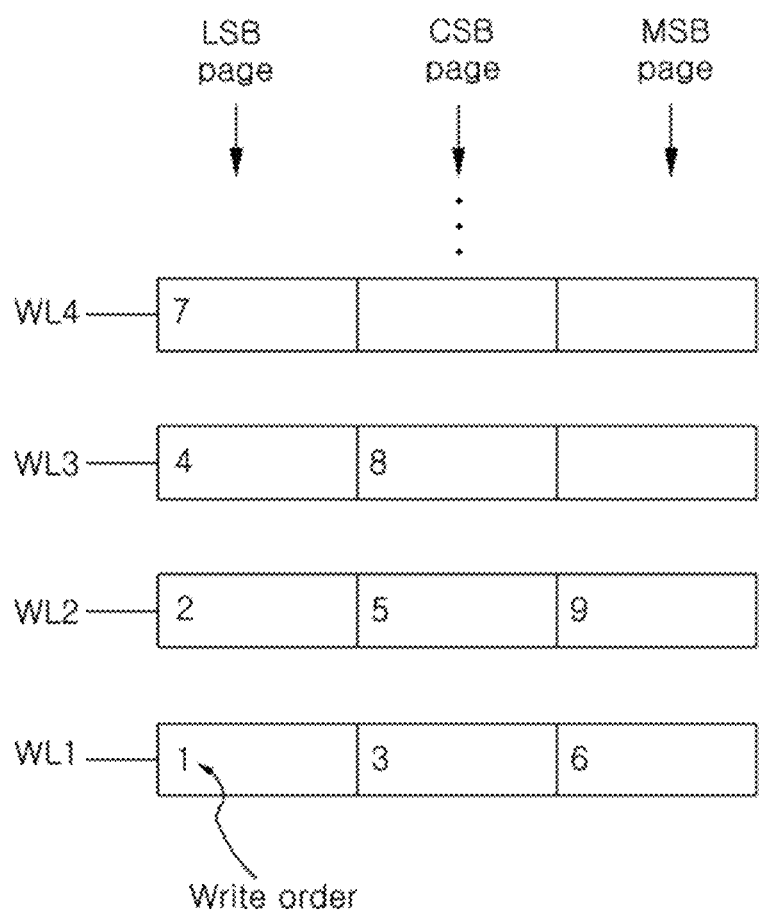

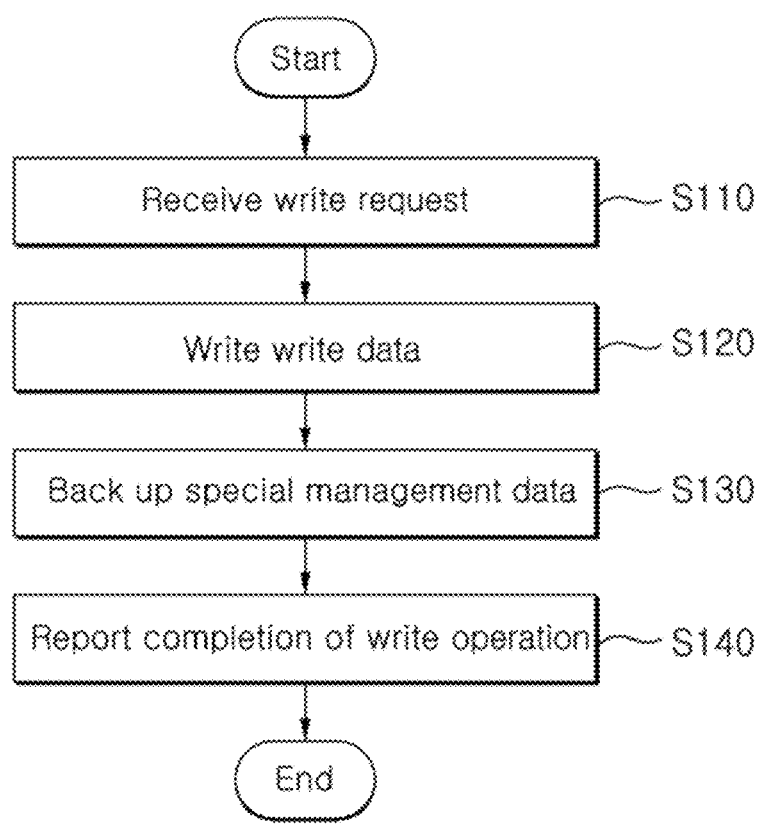

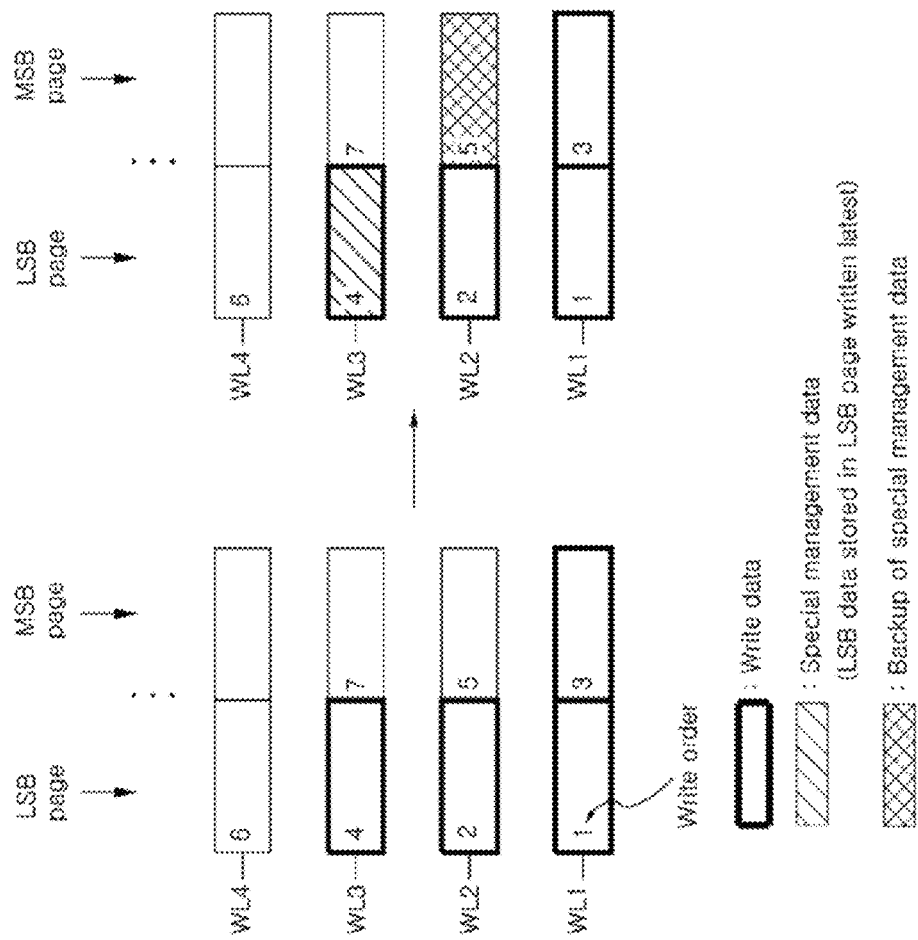

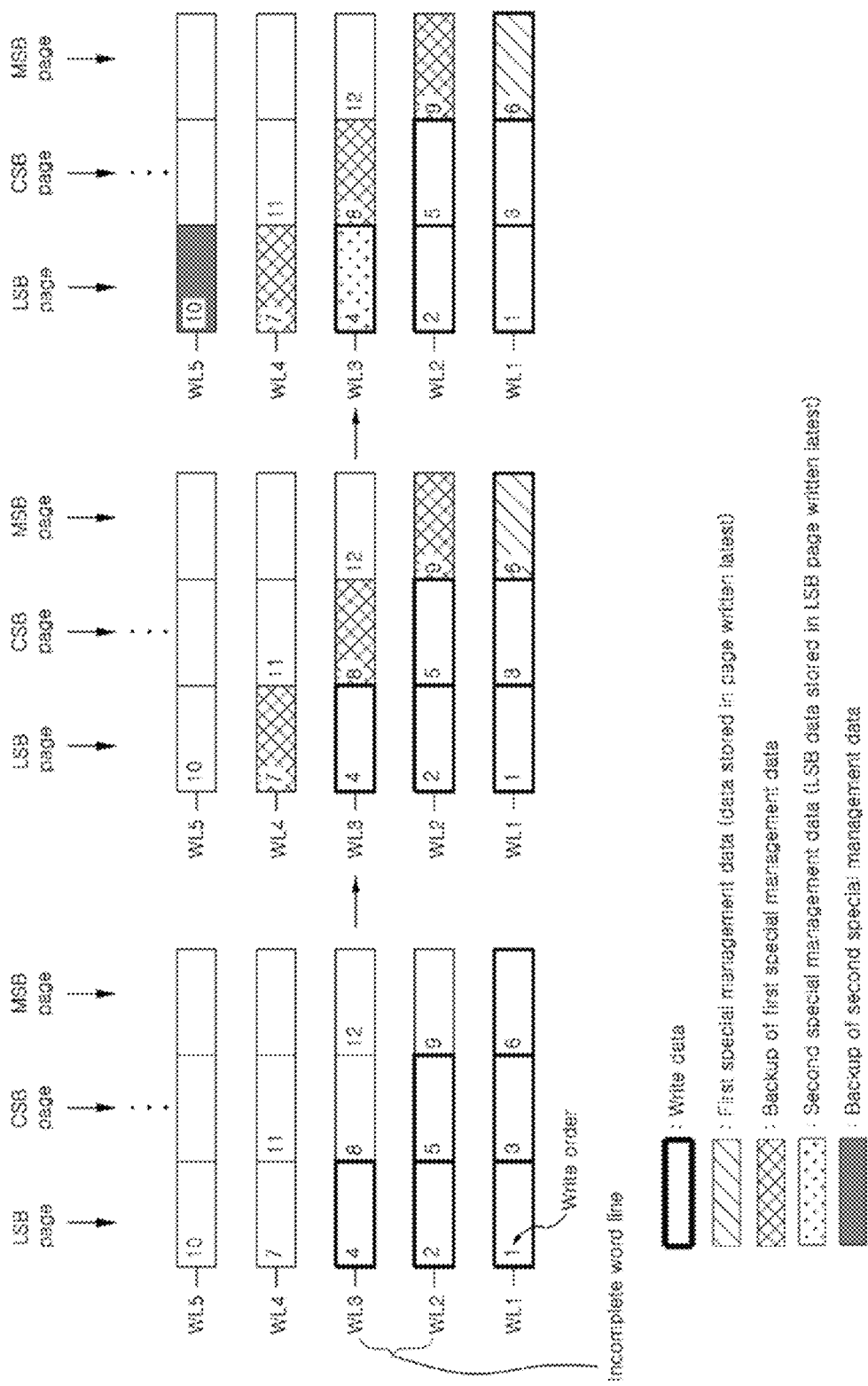

DATA STORAGE DEVICE AND OPERATING METHOD THEREOF

CROSS-REFERENCES TO RELATED APPLICATION

The present application claims priority under 35 U.S.C. 119(a) to Korean application number 10-2014-0183308, filed on Dec. 18, 2014, in the Korean Intellectual Property Office, which is incorporated herein by reference in its entirety.

BACKGROUND

1. Technical Field

Various embodiments generally relate to a data storage device and, more particularly, to an operating method of a data storage device for preventing data loss due to a sudden power-off.

2. Related Art

A semiconductor memory device may be used to store data. Semiconductor memory devices may be divided into nonvolatile and volatile memory devices.

The nonvolatile memory devices maintain data stored therein even though power is cut off. The nonvolatile memory devices include flash memory devices such as NAND flash or NOR flash, Ferroelectrics Random Access Memory (FeRAM), Phase-Change Random Access Memory (PCRAM), Magnetoresistive Random Access Memory (MRAM) or Resistive Random Access Memory (ReRAM).

The volatile memory devices fail to maintain data stored therein when power is cut off. The volatile memory devices include Static Random Access Memory (SRAM) and Dynamic Random Access Memory (DRAM). The volatile memory devices are generally used as buffer memory devices, cache memory devices, or working memory devices in a data processing system, based on their relatively high processing speed.

SUMMARY

In an embodiment, a data storage device may include: a nonvolatile memory apparatus including a memory block including a plurality of pages; and a processor suitable for writing write data in target pages of the memory block, and backing up special management data of the write data in at least one backup page of the memory block.

In an embodiment, an operating method of a data storage device may include: writing write data in target pages selected from a plurality of pages ire response to a write order which is set to minimize interference effects that are induced among the plurality of pages; and backing up special management data of the write data in at least one backup page among the plurality of pages, wherein the backup page is a page which is selected subsequently to the target pages in response to the write order among the plurality of pages.

In an embodiment, an operating method of a data storage device including first to third word lines, which are sequentially disposed, may include: writing first data in a least significant bit page of the second word line in response to a write request; and backing up the first data in a most significant bit page of the first word line or a least significant bit page of the third word line.

BRIEF DESCRIPTION OF THE DRAWINGS

FIGS. 4A and 4B are diagrams illustrating changes in the threshold voltage distributions of memory cells due to sprite operations.

FIGS. 6A and 6B are diagrams illustrating a write order for LSB pages and MSB pages.

FIG. 7 is a flow chart explaining an operating method of the data storage device shown in FIG. 1.

FIGS. 9A and 9B are diagrams illustrating another method for the processor shown in FIG. 1 to back up special management data.

FIGS. 10A to 10C are diagrams illustrating another method for the processor shown in FIG. 1 to back up special management data.

FIGS. 11A to 11C are diagrams illustrating another method for the processor shown in FIG. 1 to back up special management data.

DETAILED DESCRIPTION

Figure 1:
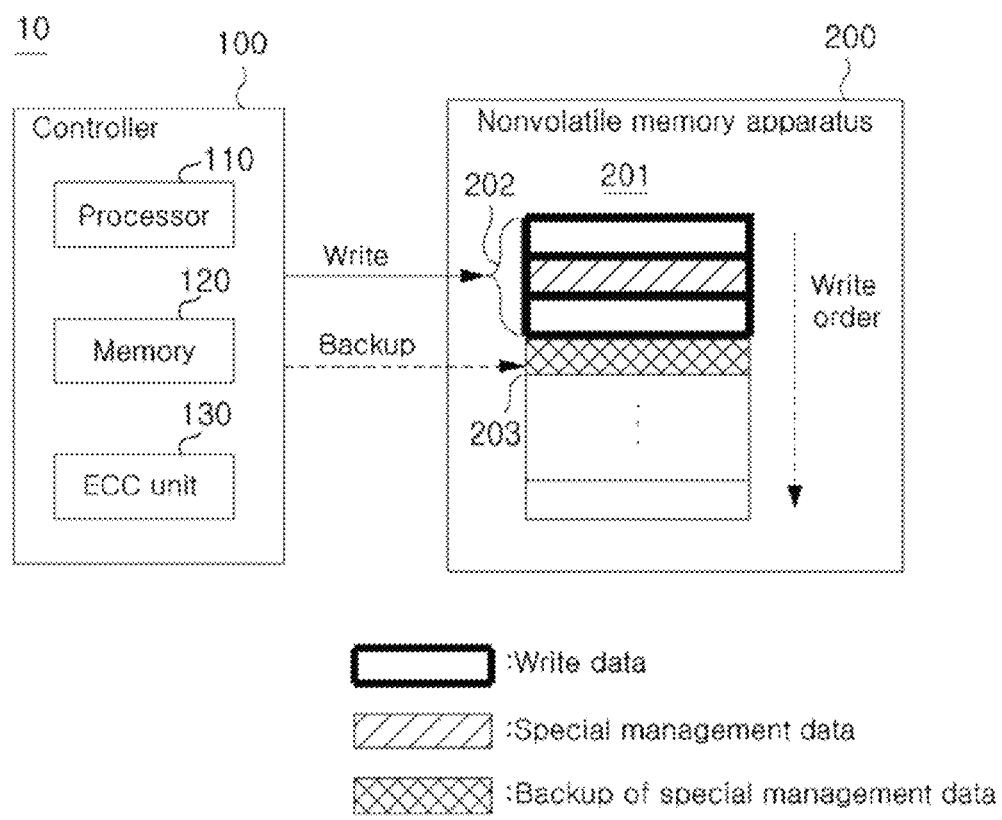
FIG. 1 is a block diagram illustrating a data storage device in accordance with an embodiment of the present invention.

Hereinafter, a data storage device and an operating method thereof according to the present invention will be described with reference to the accompanying drawings through exemplary embodiments of the present invention. The present invention may, however, be embodied in different forms and should not be construed as being limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale and, in some instances, proportions may have been exaggerated to more clearly depict certain features of the invention. While particular terminology is used, it is to be appreciated that the terminology used is for describing particular embodiments only and is not intended to limit the scope of the present invention.

FIG. 1 is a block diagram illustrating a data storage device 10 in accordance with an embodiment of the present invention.

Referring to FIG. 1, the data storage device 10 may be configured to store data provided from an external device (not shown), in response to a write request from the external device. Also, the data storage device 10 may be configured to provide stored data to the external device in response to a read request from the external device. The external device may include an electronic device capable of processing data, such as a computer, a digital camera or a mobile phone. The data storage device 10 may operate by being embedded in the external device, or may be fabricated separately and be electrically coupled to the external device.

The data storage device 10 may include a Personal Computer Memory Card International Association (PCM- CIA) card, a Compact Flash (CF) card, a smart media card, a memory stick, a multimedia card (MMC), an embedded MMC (eMMC), a reduced-size multimedia card (RS-MMC), a micro-size version of MMC (MMCmicro), a Secure Digital (SD) card, a mini secure digital (miniSD) card, a micro secure digital (microSD) card, a Universal Flash Storage (UFS), or a Solid State Drive (SSD).

The data storage device 10 may include a controller 100 and a nonvolatile memory apparatus 200.

The controller 100 may include a processor 110, a memory 120, and an error correction code (ECC) unit 130.

The processor 110 may control overall operations of the data storage device 10. The processor 110 may control a write operation or a read operation of the nonvolatile memory apparatus 200 in response to a write request or a read request from the external device. The processor 110 may generate commands for controlling the operations of the nonvolatile memory apparatus 200 and provide the generated commands to the nonvolatile memory apparatus 200. The processor 110 may drive a software program for controlling the operation of the data storage device 10, on the memory 120.

The processor 110 may write data in one or more target pages 202, which are selected from a plurality of pages 201, according to a write order set to minimize interference effects induced among the plurality of pages 201. The processor 110 may back up special management data of the data in a backup page 203 among the plurality of pages 201. The backup page 203 may be a page which is selected subsequently to the one or more target pages 202 according to the write order, among the plurality of pages 201. The backup page 203 may be a page which is to be written subsequently to the one or more target pages 202 according to the write order, among the plurality of pages 201. The one or more target pages 202 and the backup page 203 may be included in the same memory block.

Before writing the data, the processor 110 may receive a write request for the data, from the external device. The processor 110 may write the write-requested data (hereinafter, referred to as 'write data'), back up the special management data, and then report a write completion to the external device.

The memory 120 may serve as a working memory, a buffer memory, or a cache memory of the processor 110. The memory 120 may serve as the working memory that stores various program data and software programs driven by the processor 110. The memory 120 may serve as the buffer memory that buffers data transmitted between the external device and the nonvolatile memory apparatus 200. The memory 120 may serve as the cache memory that temporarily stores cache data.

The ECC unit 130 may encode the data to be written, before the data are written in the nonvolatile memory apparatus 200, to detect whether an error has occurred when subsequently reading data, and correct the detected error. For example, the ECC unit 130 may encode the data to be written by generating parity data for the data to be written in the nonvolatile memory apparatus 200 and adding the generated parity data to the data to be written.

When the encoded data are read from the nonvolatile memory apparatus 200, the ECC unit 130 may decode the read data, that is, perform an error correcting operation on the read data. For example, the ECC unit 130 may perform the error correcting operation by detecting an error that has occurred in the read data and correcting the detected error based on the parity data included in the read data.

The nonvolatile memory apparatus 200 may store data under the control of the controller 100. The nonvolatile memory apparatus 200 may retain the stored data even though power is not supplied. The nonvolatile memory apparatus 200 may store data through a write operation, and read stored data through a read operation.

The nonvolatile memory apparatus 200 may include the plurality of pages 201. The data may be sequentially written in the plurality of pages 201 according to the write order. The write order may be set to minimize the interference effects induced among the plurality of pages 201.

Figure 2:
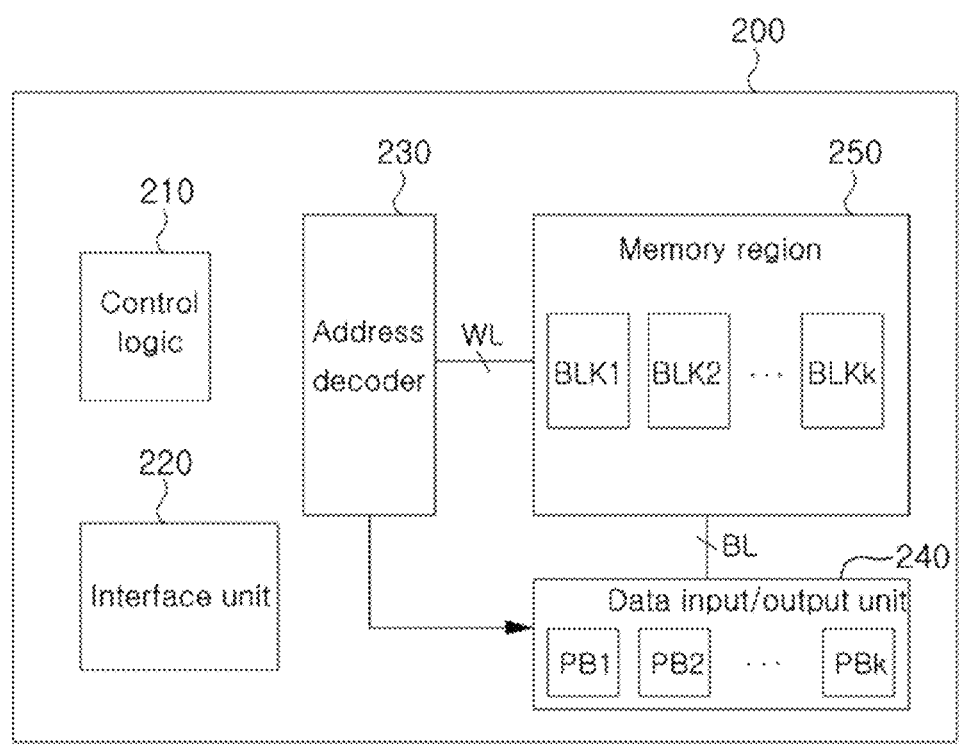
FIG. 2 is a block diagram illustrating a nonvolatile memory apparatus shown in FIG. 1.

FIG. 2 is a block diagram illustrating the non-volatile memory apparatus 200 shown in FIG. 1.

Referring to FIG. 1, the nonvolatile memory apparatus 200 may include a control logic 210, an interface unit 220, an address decoder 230, a data input/output unit 240, and a memory region 250.

The control logic 210 may control overall operations of the nonvolatile memory apparatus 200. The control logic 210 may control a write, read or erase operation on the memory region 250, in response to an access command provided from the controller 100, for example, a write, read or erase command.

The interface unit 220 may exchange various control signals including the access command and data with the controller 100. The interface unit 220 may transmit the various control signals and the data inputted thereto, to internal units of the nonvolatile memory apparatus 200.

The address decoder 230 may decode row addresses and column addresses. The address decoder 230 may control word lines WL to be selectively driven in response to the decoded row addresses. The address decoder 230 may control the data input/output unit 240 such that bit lines are selectively driven in response to the decoded column addresses.

The data input/output unit 240 may transmit the data transmitted from the interface unit 220 to the memory region 250 through the bit lines BL. The data input/output unit 240 may transmit the data read through the bit lines BL from the memory region 250 to the interface unit 220. The data input/output unit 240 may include a plurality of page buffers PB1 to PBk, which respectively correspond to a plurality of memory blocks BLK1 to BLKk, to temporarily store the transmitted data.

The memory region 250 may include the plurality of memory blocks BLK1 to BLKk. The memory block may be a unit by which an erase operation is performed on the memory region 250.

Figure 3:
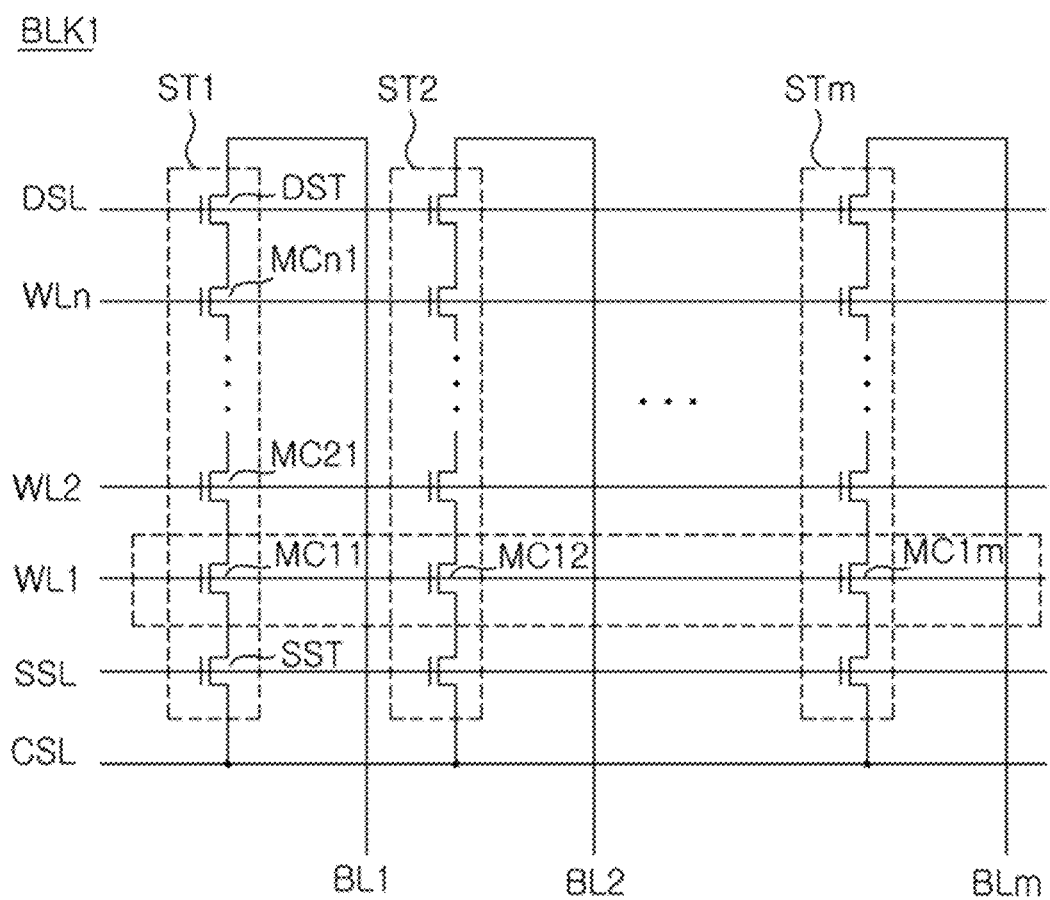
FIG. 3 is a circuit diagram illustrating a first memory block shown in FIG. 2.

FIG. 3 is a circuit diagram illustrating the first memory block BLK1 shown in FIG. 2. Since the memory blocks BLK1 to BLKk shown in FIG. 2 may be configured in substantially the same manner, the first memory block BLK1 will be described as an example. While it is illustrated as an example in FIG. 3 that the first memory block BLK1 is configured by a two-dimensional array, it is to be noted that the embodiments are not limited to such an example and the first memory block BLK1 may be configured by, for example, a three-dimensional array.

Referring to FIG. 3, the first memory block BLK1 may include a plurality of strings ST1 to STm. The respective strings ST1 to STm may be electrically coupled between a corresponding one of the bit lines BL1 to BLm and a common source line CSL. Since the strings ST1 to STm have substantially the same configuration, the configuration of the first string ST1 will be described as an example. The first string ST1 may be electrically coupled between the first bit line BL1 and the common source line CSL. The first string ST1 may include a drain select transistor DST, a source select transistor SST, and a plurality of memory cells MC11 to MCn1. The drain select transistor DST may have a gate electrically coupled to a drain select line DSL, and a drain electrically coupled to the first bit line BL1. The source select transistor SST may have a gate electrically coupled to a source select line SSL, and a source electrically coupled to the common source line CSL. The plurality of memory cells MC11 to MCn1 may be electrically coupled in series between the drain select transistor DST and the source select transistor SST, and the respective gates thereof may be electrically coupled to a corresponding one of the word lines WL1 to WLn.

The memory cells may be classified based on the number of bits stored in each memory cell. For example, the memory cells may be classified into single level cells, each of which stores 1 bit, and mufti-level cells, each of which stores at least 2 bits.

A page may be a unit by which a write operation or a read operation is performed on the memory region 250. In other words, the data stored in memory region 250 may be written or read in units of pages. Since the respective addresses are assigned to the pages, the pages may be identified in response to the addresses. The page may be accessed by driving a corresponding word line.

When each of the memory cells electrically coupled to a certain word line stores 1 bit, the corresponding word line may correspond to one page.

When each of the memory cells electrically coupled to one word line stores 2 bits, that is, least significant bit (LSB) data and most significant bit (MSB) data, the corresponding word line may correspond to 2 pages, that is, an LSB page and an MSB page. In each of the memory cells electrically coupled to one word line, the LSB data may configure the LSB page, and the MSB data may configure the MSB page.

When each of the memory cells electrically coupled to one word line stores 3 bits, that is, least significant bit (LSB) data, central significant bit (CSB) data and most significant bit (MSB) data, the corresponding word line may correspond to 3 pages, that is, an LSB page, a CSB page and an MSB page. In each of the memory cells electrically coupled to one word line, the LSB data may configure the LSB page, the CSB data may configure the CSB page, and the MSB data may configure the MSB page.

Figure 4A:
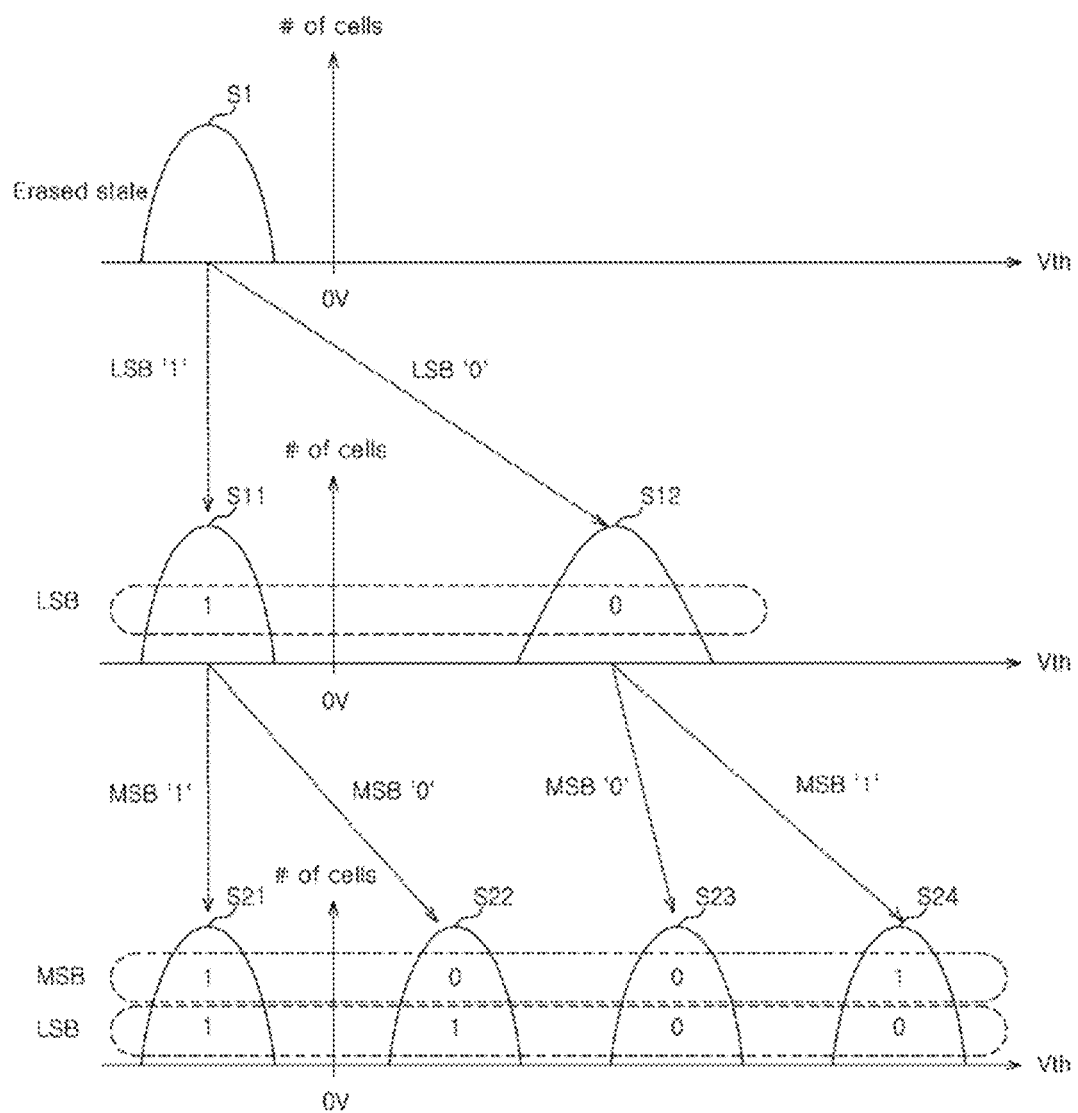

FIGS. 4A and 4B are diagrams illustrating changes in the threshold voltage distributions of memory cells due to write operations. Since, as described above, a write operation may be performed in the unit of pages by accessing a word line corresponding to an address, FIGS. 4A and 4B may mean the threshold voltage distributions of the memory cells, for example, the memory cells MC11 to MC1m, electrically coupled to any one word line, for example, the first word line WL1. FIG. 4A shows a case where 2-bit data are stored in each memory cell, and FIG. 4B shows a case where 3-bit data are stored in each memory cell.

Data may be identified based on the threshold voltage of a memory cell in which the data is stored. That is to say, when writing data in a memory cell, the threshold voltage of the corresponding memory cell may vary.

Referring to FIG. 4A, memory cells in an erased state may form threshold voltage distribution S1. After LSB data may be written in the memory cells in the erased state, MSB data may be additionally written in the state in which the LSB data is written.

The memory cells in the erased state may form threshold voltage distribution S11 or threshold voltage distribution S12 based on LSB data to be written. The threshold voltages of the memory cells may form the threshold voltage distribution S11 when LSB data "1" is written, and may be increased to form the threshold voltage distribution S12 when LSB data "0" is written. The LSB data stored in the memory cells may configure an LSB page.

The memory cells written with the LSB data may form threshold voltage distributions 521 to S24 based on MSB data to be additionally written. For example, the threshold voltages of the memory cells written with the LSB data "1" may form the threshold voltage distribution 521 when MSB data "1" is additionally written, and may be increased to form the threshold voltage distribution S22 when MSB data "0" is additionally written. The MSB data stored in the memory cells may configure an MSB page.

Referring to FIG. 4B, in the state shown in FIG. 4A, that is, in the state in which 2 bits are written in each memory cell, 1 bit may be additionally written. The memory cells written with CSB data may form threshold voltage distributions S31 to S38 based on MSB data to be additionally written.

The nonvolatile memory apparatus 200 may apply preset voltages to a word line and a bit line corresponding to a memory cell such that the memory cell has a predetermined threshold voltage. The nonvolatile memory apparatus 200 may apply a program voltage to a corresponding word line based on, for example, an incremental step pulse program (ISPP) scheme. The nonvolatile memory apparatus 200 may apply a program permission voltage to a corresponding bit line to increase the threshold voltage of the memory cell, and may apply a program prohibition voltage to the corresponding bit line to retain the threshold voltage.

Figure 5:
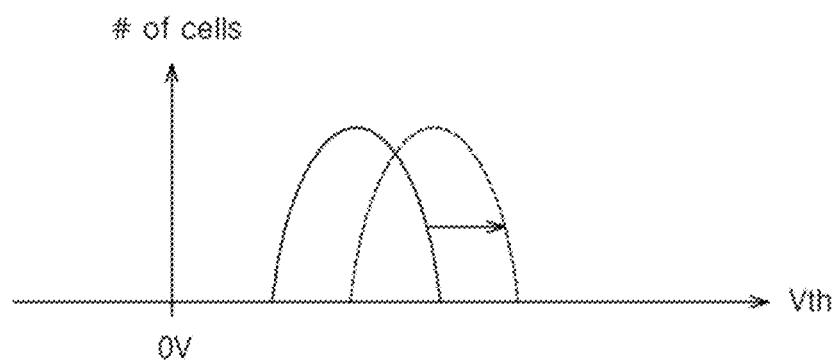
FIG. 5 is a diagram illustrating a migration in threshold voltage distribution due to interference effects.

FIG. 5 is a diagram illustrating a migration in the threshold voltage distribution due to interference effects.

Referring to FIG. 5, as memory cells are written with data and form a predetermined threshold voltage, adjacent memory cells may be affected by the memory cells due to interference effects. The adjacent memory cells may have threshold voltages that are different from the threshold voltage which is formed when the data is written, and may have shifted threshold voltage distributions as shown in FIG. 5. As the interference effect is greater, a change in the threshold voltage may be large and, as a result, the data stored in the memory cells may be changed or lost.

FIGS. 6A and 6B are diagrams illustrating a write order for the plurality of pages included in one memory block. FIG. 6A shows a case where 2 bits are stored in each memory cell, and shows LSB pages and MSB pages corresponding to first to fourth word lines WL1 to WL4. FIG. 6B shows a case where 3 bits are stored in each memory cell, and shows LSB pages, CSB pages and MSB pages corresponding to first to fourth word lines WL1 to WL4.

The plurality of pages included in one memory block may be written according to the write order. The write order may be set to minimize the interference effects induced among pages or word lines.

Referring to FIG. 6A, the write order may include a sequence of the LSB page of the first word line WL1, the LSB page of the second word line WL2, the MSB page of the first word line WL1, the LSB page of the third word line WL3, the MSB page of the second word line WL2, the LSB page of the fourth word line WL4, and the MSB page of the third word line WL3. As shown, since the LSB page and the MSB page corresponding to one word line are discretely written, the interference effects may be minimized.

Referring to FIG. 6B, the write order may include a sequence of the LSB page of the first word line WL1, the LSB page of the second word line WL2, the CSB page of the first word line WL1, the LSB page of the third word line WL3, the CSB page of the second word line WL2, the MSB page of the first word line WL1, the LSB page of the fourth word line WL4, the CSB page of the third word line WL3, and the MSB page of the second word line WL2. As shown, since the LSB page, the CSB page and the MSB page corresponding to one word fine are discretely written, the interference effects may be minimized.

As described above, for example, when 2 bits are stored in each memory cell, the data storage device 10 may also write MSB data by changing the threshold voltage distribution of LSB data for a particular word line. Therefore, if a sudden power-off occurs while the data storage device 10 writes the MSB data, the LSB data stored in the LSB page of the word line on which the write operation is performed may be lost.

In writing LSB data and MSB data for one word line in response to one write request, even though a sudden power-off occurs while writing MSB data, the data storage device 10 may process the sudden power-off as an operation fail to an external device. Further, the data storage device 10 may restart the write operation when power supply is restarted, and may write and thereby recover lost LSB data.

However, in writing MSB data after writing LSB data in response to discrete write requests for one word line, if a sudden power-off occurs while writing MSB data, the data storage device 10 may lose LSB data forever.

According to the previous embodiment, the data storage device 10 may back up special management data to prevent loss of LSB data due to a sudden power-off.

FIG. 7 is a flow chart explaining an operating method of the data storage device 10 shown in FIG. 1.

Referring to FIG. 7, at step S110, the data storage device 10 may receive a write request from an external device. The data storage device 10 may receive write data together with the write request from the external device.

At step S120, the data storage device 10 may perform a write operation to write the write data in target pages which are selected according to a write order, among a plurality of pages.

At step S130, the data storage device 10 may back up special management data among the write data, in a backup page among the plurality of pages. The data storage device 10 may determine data which needs to back up, as the special management data. The data storage device 10 may read the special management data from the write data written in the target pages, and write the read special management data in the backup page. The backup page may be a page that is selected subsequently to the target pages according to the write order, among the plurality of pages. The data storage device 10 may back up the special management data in the same memory block in which the write data are written. An operation of the data storage device 10 to determine the special management data will be described below in detail with reference to FIGS. 8A to 11c.

At step S140, the data storage device 10 may report completion of the write operation to the external device.

Figure 8A:
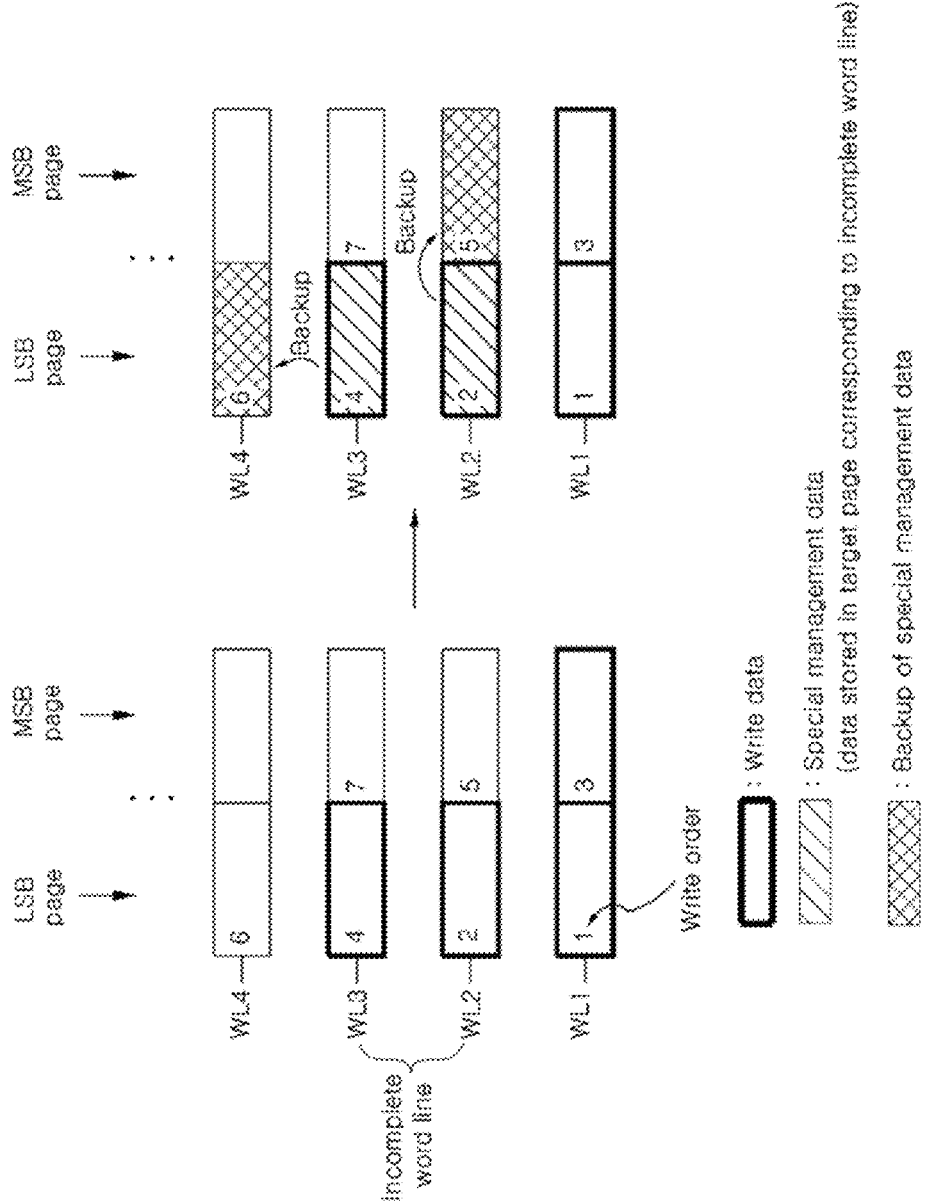
FIGS. 8A and 8B are diagrams illustrating a method for a processor, shown in FIG. 1, to back up special management data.
Figure 8B:
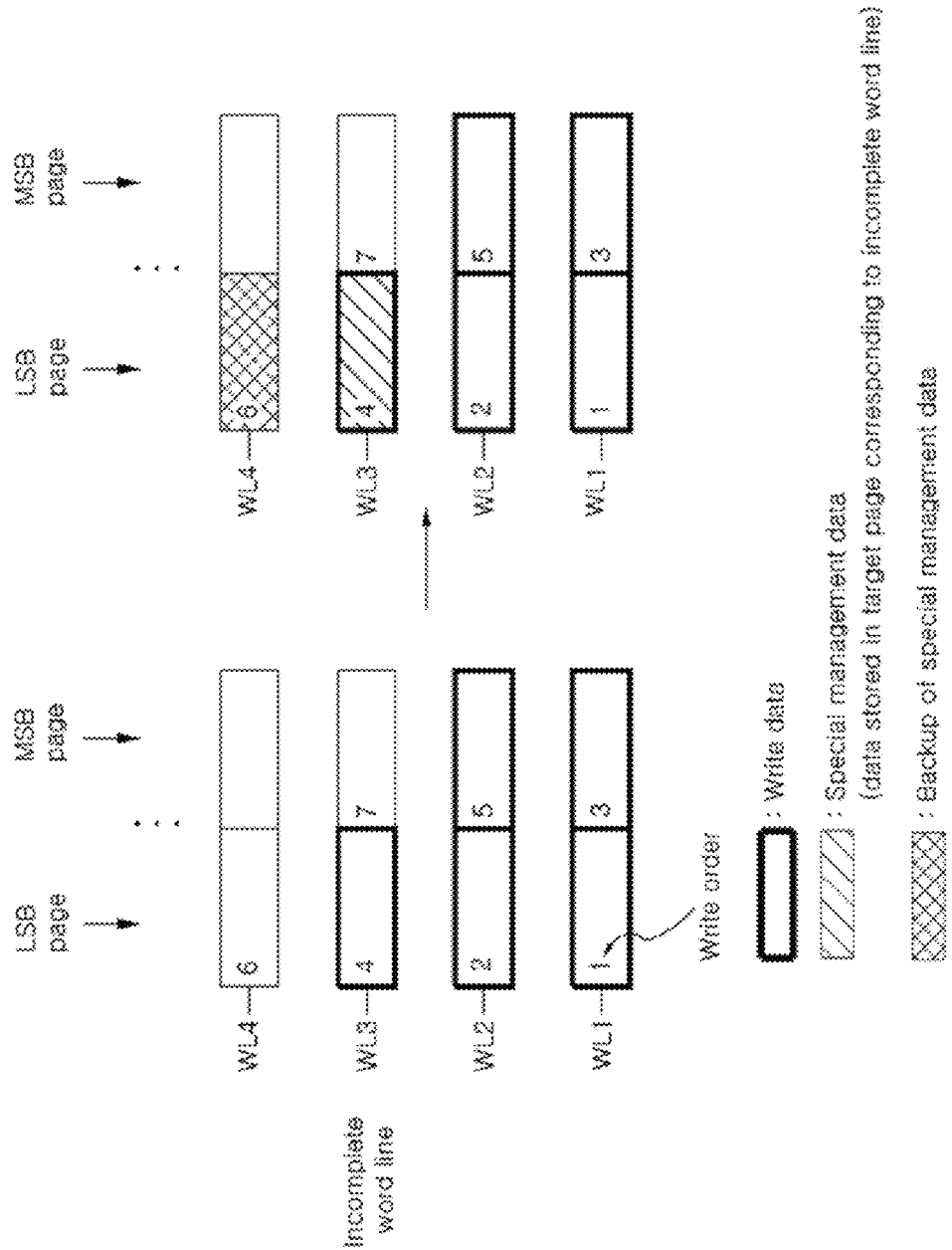

FIGS. 8A and 8B are diagrams illustrating a method for the processor 110 shown in FIG. 1 to back up the special management data.

In FIGS. 8A and 8B, it is assumed that the data storage device 10 has written the write data provided from the external device, in the target pages selected according to the write order. In FIGS. 8A and 8B, the sizes of the write data may be different and, accordingly, the target pages in which the write data are written may be different. FIGS. 8A and 8B show where 2 bits are stored in each memory cell, that is, where 2 pages correspond to one word line, but the embodiments are not limited to this example.

The processor 110 may back up the special management data in at least one backup page selected subsequently to the target pages according to the write order. In detail the processor 110 may determine data stored in a target page corresponding to an incomplete word line, as the special management data. The incomplete word line may be a word line in which some pages among a plurality of pages sharing the corresponding word line are written and the remaining pages are not written. For example, when the state in which the LSB page of a word line is written and the MSB page of the word line is not written, the word line is defined as an incomplete word line.

FIG. 8A shows when the write data are written from the LSB page of the first word line WL1 to the LSB page of the third word line WL3 according to the write order. FIG. 8A is a drawing for explaining, as an example, that a target page to be written most recently is an LSB page.

When a write operation is performed from the LSB page of the first word line WL1 to the LSB page of the third word line WL3 according to the write order, incomplete word lines may include the second word line WL2 and the third word line WL3. The processor 110 may determine the LSB data stored in target pages corresponding to the second word line WL2 and the third word line as the special management data. The processor 110 may back up the special management data in backup pages. At this time, the backup pages may become the MSB page of the second word line WL2 and the LSB page of the fourth word line WL4, since the backup pages are selected subsequently to the target pages according to the write order.

When a new write request is received thereafter, the processor 110 may write data in the MSB page of the third word line WL3. Even when a sudden power-off occurs while the write operation is performed on the MSB page of the third word line WL3, since the data stored in the LSB page of the third word line WL3 was backed up in the LSB page of the fourth word line WL4, loss of LSB data may be prevented.

FIG. 8B shows where the write data are written from the LSB page of the first word line WL1 to the MSB page of the second word line WL2 according to the write order. FIG. 8B is a drawing for explaining, as an example, that a target page to be written most recently is an MSB page.

Where a write operation is performed from the LSB page of the first word line WL1 to the MSB page of the second word line WL2 according to the Trite order, an incomplete word line may be the third word line WL3. The processor 110 may determine the LSB data stored in a target page corresponding to the third word line WL3, as the special management data. The processor 110 may back up the special management data in a backup page, that is, the LSB page of the fourth word line WL4.

When a new write request is received thereafter, the processor 110 may write data in the MSB page of the third word line WL3. Even when a sudden power-off occurs while the write operation is performed on the MSB page of the third word line WL3, since the data stored in the LSB page of the third word line WL3 was backed up in the LSB page of the fourth word line WL4, loss of LSB data may be prevented.

Figure 9B:
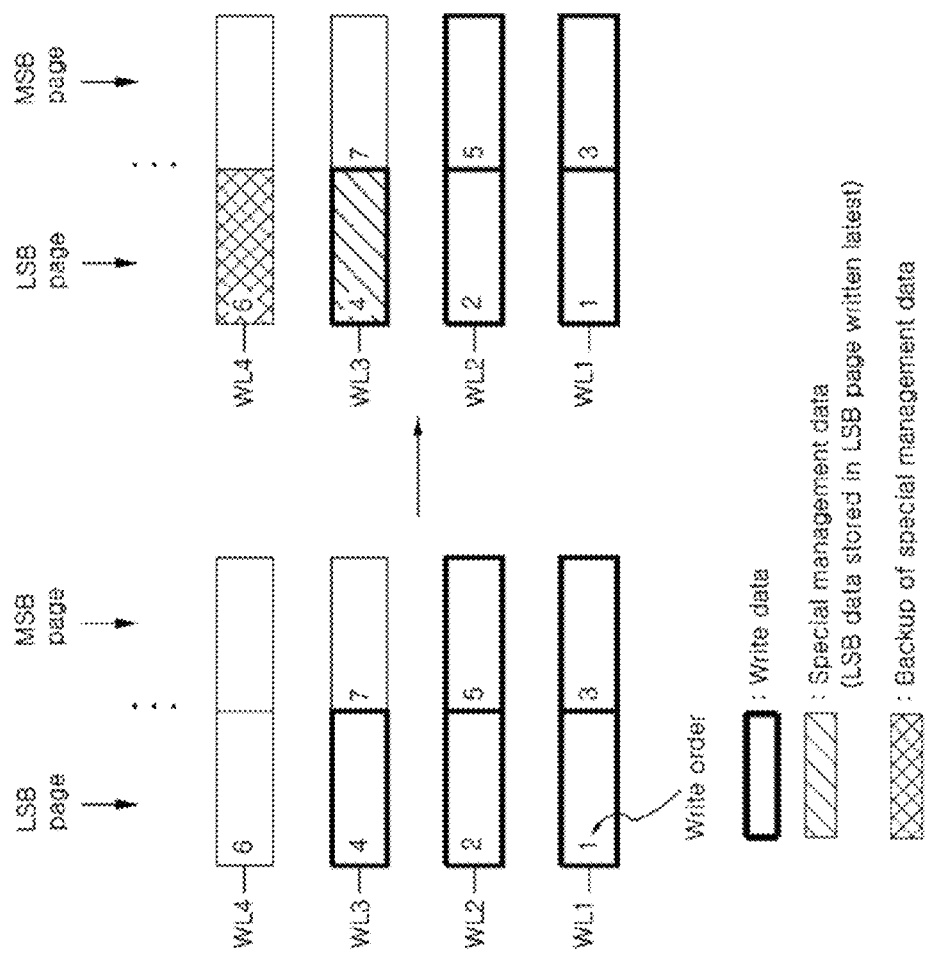

FIGS. 9A and 9B are diagrams illustrating another method for the processor 110 shown in FIG. 1 to back up the special management data.

In FIGS. 9A and 9B, it is assumed that the data storage device 10 has written the write data provided from the external device in the target pages selected according to the write order. In FIGS. 9A and 9B, the sizes of the write data may be different and, accordingly, the target pages in which the write data are written may be different. FIGS. 9A and 9B show a case where 2 bits are stored in each memory cell, that is, where 2 pages correspond to one word line, but the embodiments are not limited to this example.

The processor 110 may determine the LSB data shred in an LSB page, which is written most recently among the target pages, as the special management data. The LSB page written most recently may be the target page that is written most recently among LSB pages.

FIG. 9A shows where the write data are written from the LSB page of the first word line WL1 to the LSB page of the third word line WL3 according to the write order. FIG. 9A is a drawing for explaining, as an example, that a target page to be written most recently is an LSB page.

Where a write operation is performed from the LSB page of the first word line WL1 to the LSB page of the third word line WL3 according to the write order, the processor 110 may determine the LSB data stored in the LSB page of the third word line WL3, as the special management data. The processor 110 may back up the special management data in a backup page, that is, the MSB page of the second word line WL2.

The backup method shown in FIG. 9A may be efficient since the number of pages to be used as backup pages is less than the backup method shown in FIG. SA and the effect of preventing loss of LSB data may be achieved in the same manner.

FIG. 9B shows where the write data are written from the LSB page of the first word line WL1 to the MSB page of the second word line WL2 according to the write order. FIG. 9B is a drawing for explaining, as an example, that a target page to be written most recently is an MSB page.

When a write operation is performed from the LSB page of the first word line WL1 to the MSB page of the second word line WL2 according to the write order, the processor 110 may determine the LSB data stored in the LSB page of the third word line WL3, as the special management data. The processor 110 may back up the LSB data stored in the LSB page of the third word line WL3, in a backup page, that is, the LSB page of the fourth word line WL4.

Figure 10A:
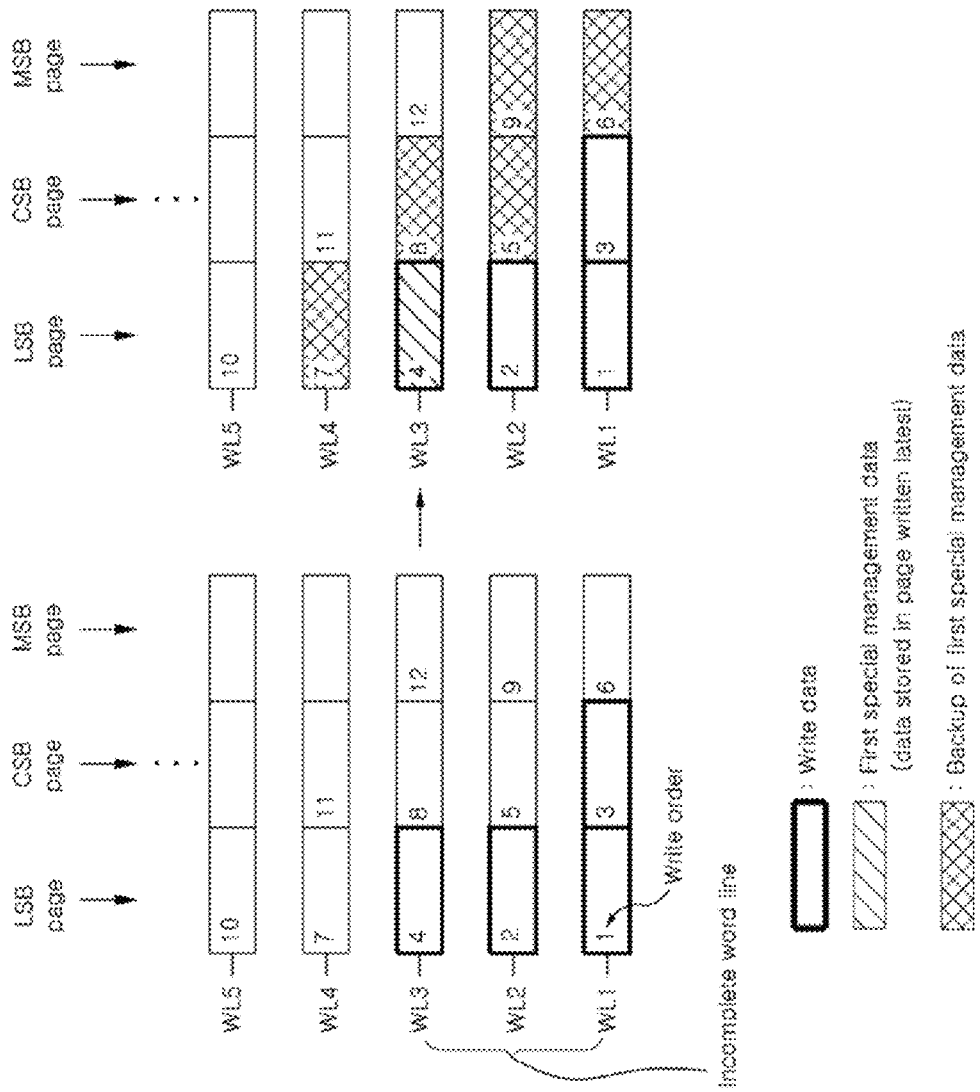
Figure 10B:
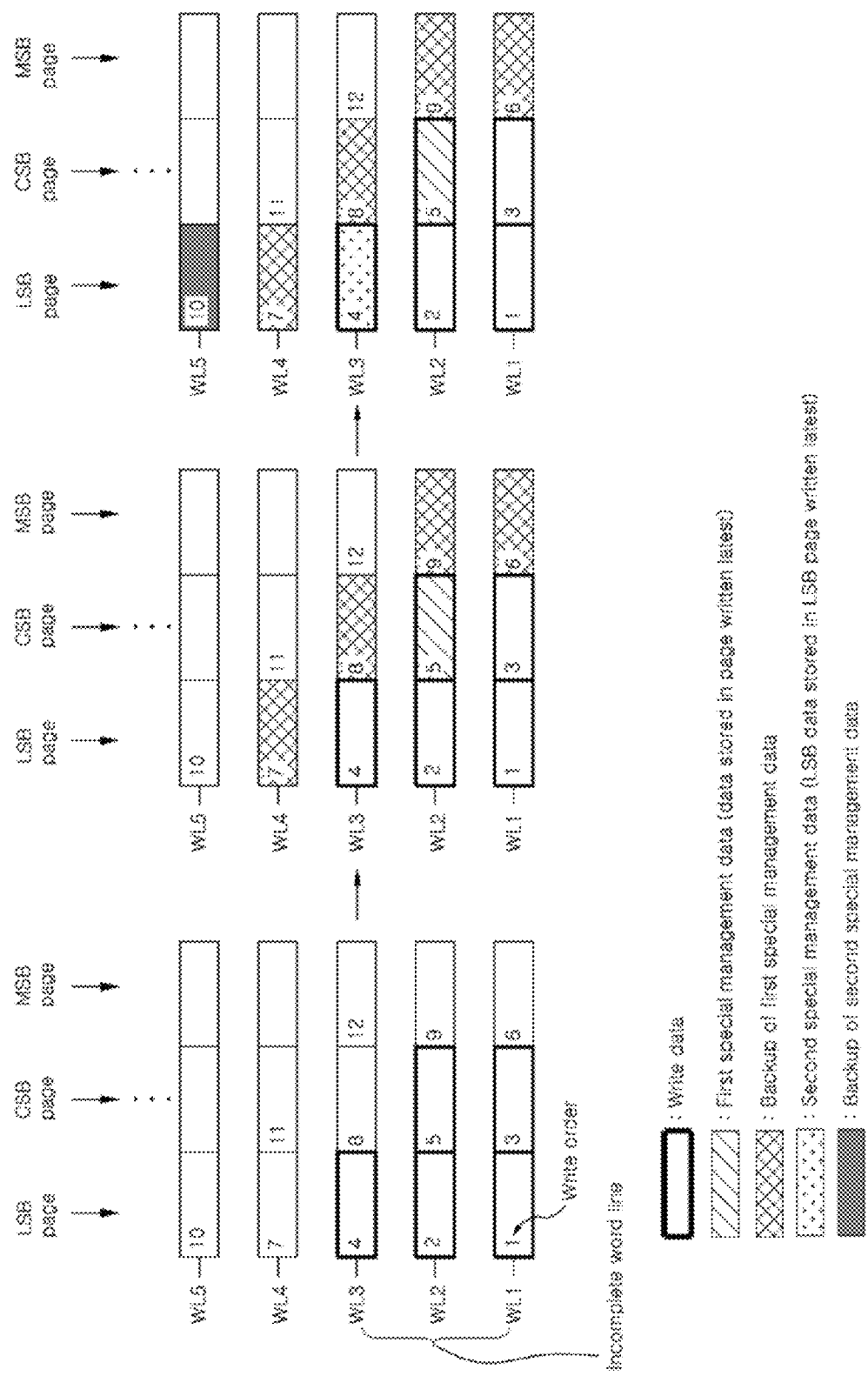

FIGS. 10A to 10C are diagrams illustrating another method for the processor 110 shown in FIG. 1 to back up the special management data.

In FIGS. 10A to 10C, it is assumed that the data storage device 10 has written the write data provided from the external device in the target pages selected according to the write order. In FIGS. 10A to 10C, the sizes of the write data may be different, and accordingly, the target pages in which the write data are written may be different. FIGS. 10A to 10C show where 3 bits are stored in each memory cell, that is, where LSB, CSB and MSB pages correspond to one word line, but the embodiment is not limited to such an example.

The processor 110 may back up first and second special management data in one or more backup pages selected subsequently to the target pages according to the write order. In detail, the processor 110 may determine data stored in a page which is written most recently among the target pages, as the first special management data. The processor 110 may repeatedly back up the first special management data in the backup pages selected according to a predetermined rule. For example, the processor 110 may back up the first special management data by selecting the backup pages in response to the number of empty pages corresponding to an incomplete word line. Then, the processor 110 may determine the LSB data stored in an LSB page which is written most recently among the target pages, as the second special management data. After completing the backup of the first special management data, the processor 110 may additionally back up the second special management data.

When the second special management data is the same as the first special management data, which is already backed up, the processor 110 may omit a backup process for the second special management data. For example, when the target page written most recently is an LSB page, the LSB data stored in the corresponding LSB page may be determined as the first special management data at the same time as the second special management data, and the processor 110 may omit the backup process for the second special management data.

FIG. 10A shows a case where the write data are written from the LSB page of the first word line WL1 to the LSB page of the third word line WL3 according to the write order. FIG. 10A is a drawing for explaining, as an example, that a target page to be written most recently is an LSB page.

When a write operation is performed from the LSB page of the first word line WL1 to the LSB page of the third word line WL3 according to the write order, the processor 110 may determine the LSB data stored in the LSB page of the third word line WL3, as the first special management data. The processor 110 may back up the first special management data by selecting backup pages in response to the number of empty pages corresponding to incomplete word lines, that is, 5 backup pages. The backup pages may be 5 pages which are selected subsequently to the LSB page of the third word line WL3 written most recently, according to the write order.

In this case, since the target page written most recently is the LSB page of the third word line WL3, the LSB data stored in the LSB page of the third word line WL3 may be determined as the first special management data and at the same time as second special management data. Accordingly, the processor 110 may omit a backup process for the second special management data.

FIG. 10B shows a case where the write data are written from the LSB page of the first word line WL1 to the CSB page of the second word line WL2 according to the write order. FIG. 10B is a drawing for explaining, as an example, that a target page to be written most recently is a CSB page.

When a write operation is performed from the LSB page of the first word line WL1 to the CSB page of the second word line WL2 according to the write order, the processor 110 may determine the CSB data stored in the CSB page of the second word line WL2, as the first special management data. The processor 110 may back up the first special management data by selecting backup pages in response to the number of empty pages corresponding to incomplete word lines, that is, 4 backup pages. The backup pages may be 4 pages which are selected subsequently to the CSB page of the second word line WL2 written most recently, according to the write order.

Then, the processor 110 may determine the LSB data stored in the LSB page of the third word line WL3, as the second special management data. The processor 110 may back up the second special management data, in an additionally selected backup page, that is, the LSB page of the fifth word line WL5. The additionally selected backup page may be a page which is selected subsequently to the backup pages for the first special management data, according to the write order.

FIG. 10C shows a case where the write data are written from the LSB page of the first word line WL1 to the MSB page of the first word line WL1 according to the write order.

FIG. 10C is a drawing for explaining, as an example, that a target page to be written most recently is an MSB page.

When a write operation is performed from the LSB page of the first word line WL1 to the MSB page of the first word line WL1 according to the write order, the processor 110 may determine the MSB data stored in the MSB page of the first word line WL1, as the first special management data. The processor 110 may back up the first special management data by selecting backup pages in response to the number of empty pages corresponding to incomplete word lines, that is, 3 backup pages. The backup pages may be 3 pages which are selected subsequently to the MSB page of the first word line WL1 written most recently, according to the write order.

Then, the processor 110 may determine the LSB data stored in the LSB page of the third word line WL3, as the second special management data. The processor 110 may back up the second special management data, in an additionally selected backup page, that is, the LSB page of the fifth word line WL5. The additionally selected backup page may be a page which is selected subsequently to the backup pages for the first special management data, according to the write order.

Figure 11A:
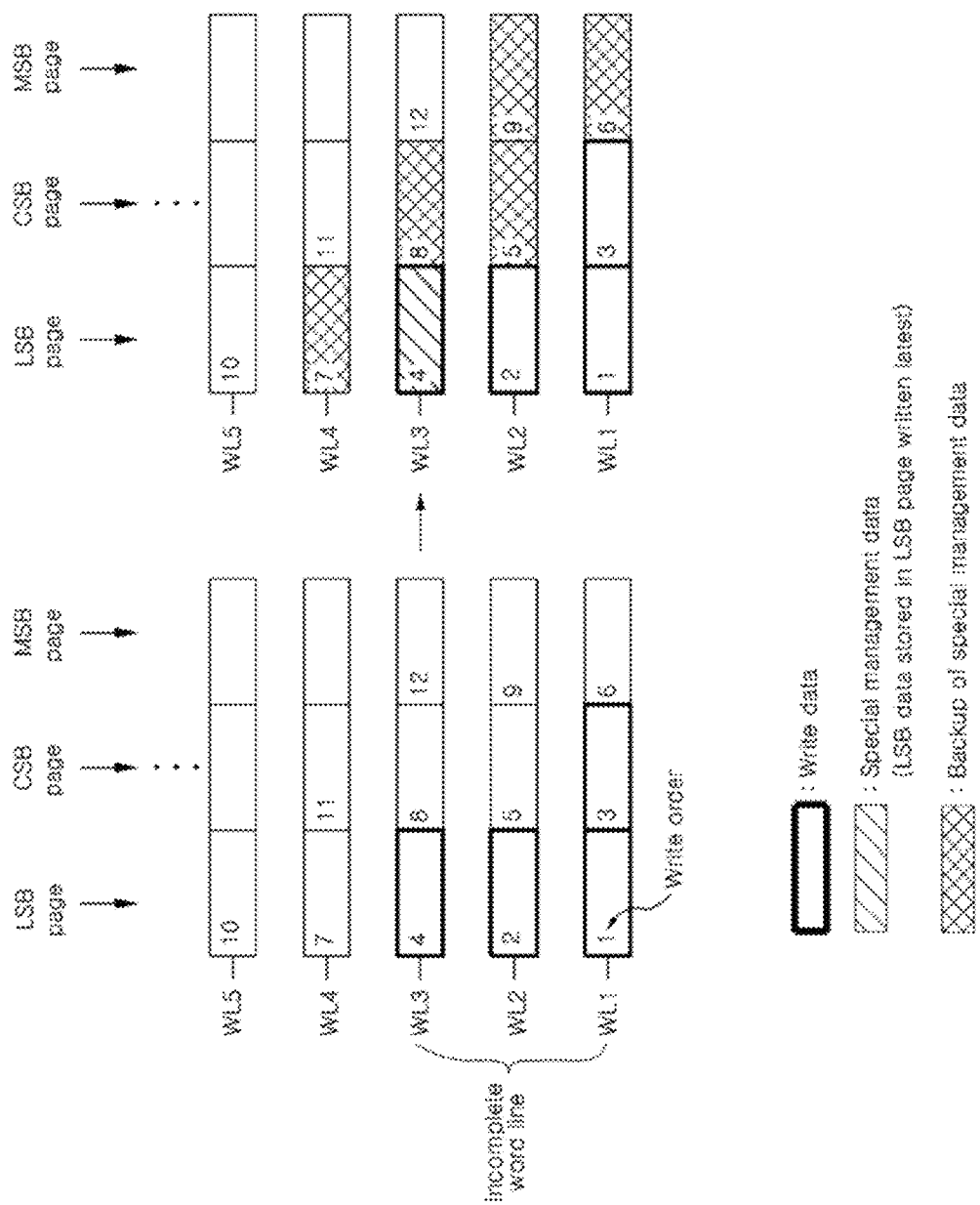
Figure 11B:
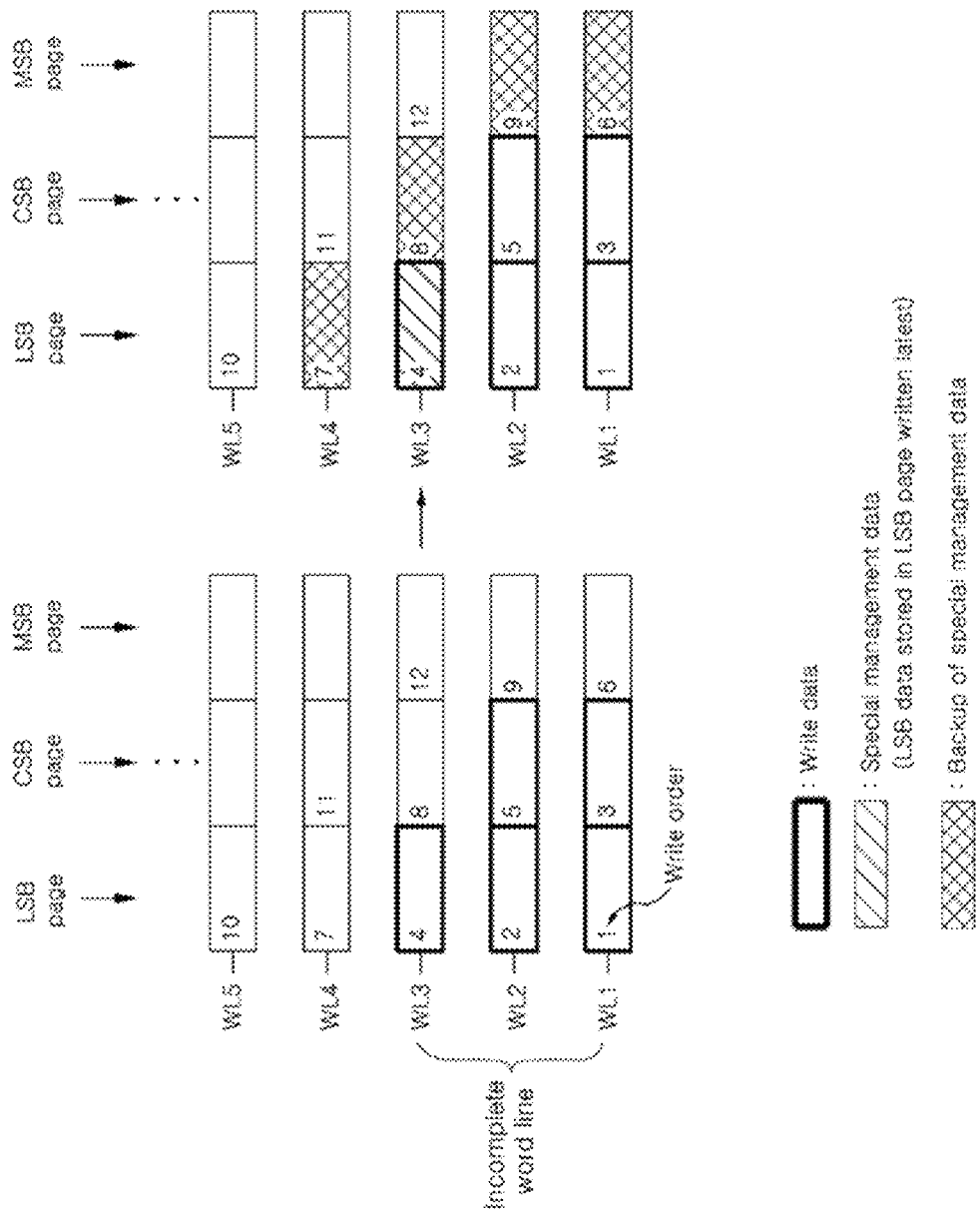
Figure 11C:
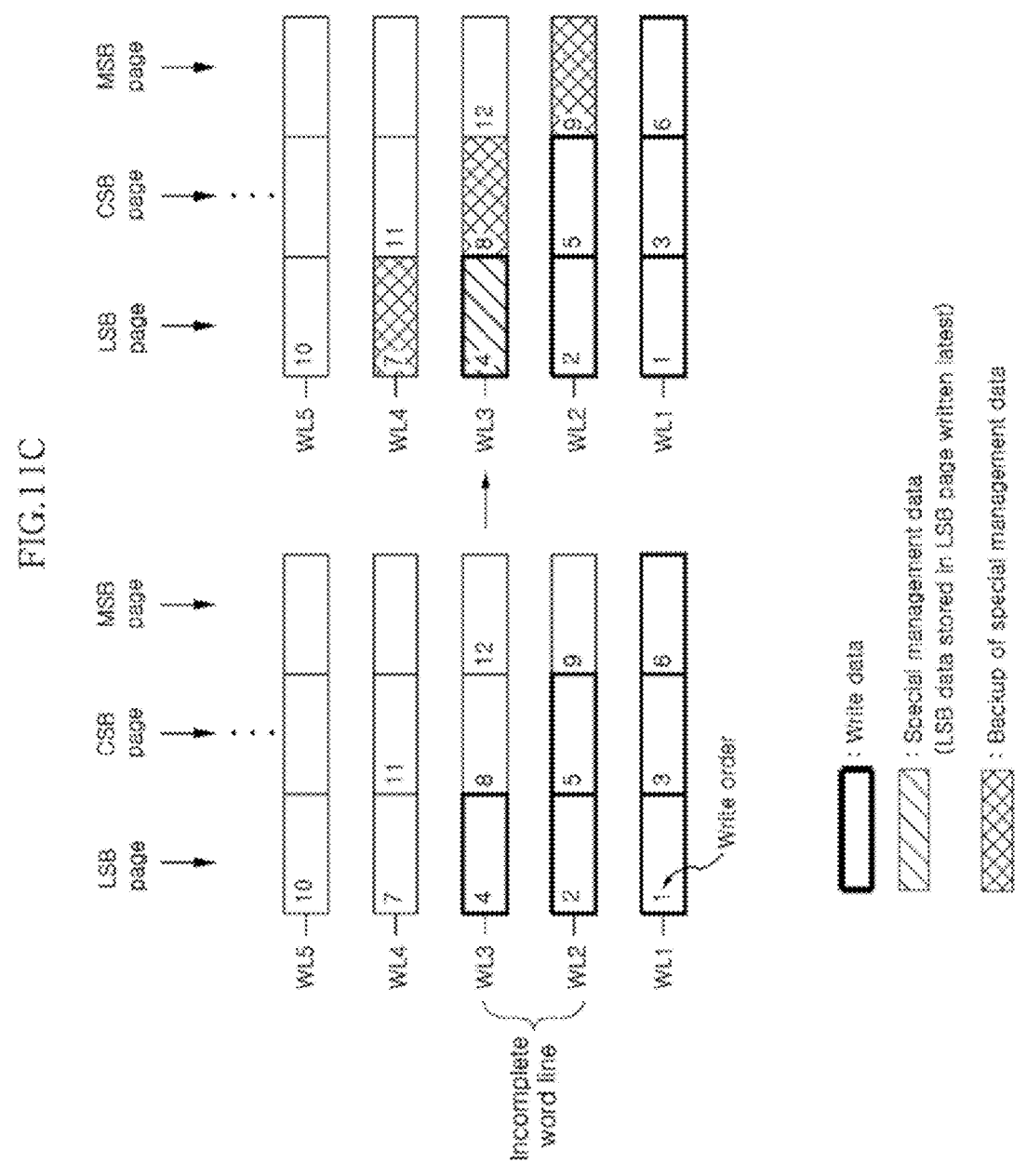

FIGS. 11A to 11C are diagrams illustrating another method for the processor 110 shown in FIG. 1 to back up the special management data.

In FIGS. 11A to 11C, it is assumed that the data storage device 10 has written the write data provided from the external device, in the target pages selected according to the write order. In FIGS. 11A to 11C, the sizes of the write data may be different, and accordingly, the target pages in which the write data are written may be different. FIGS. 11A to 11C show a case where 3 bits are stored in each memory cell, that is, where LSB, CSB and MSB pages correspond to one word line, but the embodiment is not limited to such an example.

The processor 110 may back up the special management data in one or more backup pages selected subsequently to the target pages according to the write order. In detail, the processor 110 may determine LSB data stored in an LSB page which is written most recently among the target pages, as the special management data. The processor 110 may repeatedly back up the special management data in the backup pages selected according to a predetermined rule. For example, the processor 110 may back up the special management data by selecting the backup pages in response to the number of empty pages corresponding to an incomplete word line.

FIG. 11A shows a case where the write data are written from the LSB page of the first word line WL1 to the LSB page of the third word line WL3 according to the write order. FIG. 11A is a drawing for explaining, as an example, that a target page to be written most recently is an LSB page.

The processor 110 may determine the LSB data stored in the LSB page of the third word line WL3, as the special management data. The processor 110 may back up the special management data by selecting the backup pages in response to the number of empty pages corresponding to incomplete word lines, that is, 5 backup pages. The backup pages may be 5 pages which are selected subsequently to the LSB page of the third word line WL3 written most recently, according to the write order.

FIG. 11B shows a case where the write data are written from the LSB page of the first word line WL1 to the CSB page of the second word line WL2 according to the write order. FIG. 11B is a drawing for explaining, as an example, that a target page to be written most recently is a CSB page.

The processor 110 may determine the LSB data stored in the LSB page of the third word line WL3, as the special management data. The processor 110 may back up the special management data by selecting the backup pages in response to the number of empty pages corresponding to incomplete word lines, that is, 4 backup pages. The backup pages may be 4 pages which are selected subsequently to the CSB page of the second word line WL2 written most recently, according to the write order.

FIG. 11C shows a case where the write data are written from the LSB page of the first word line WL1 to the MSB page of the first word line WL1 according to the write order. FIG. 11C is a drawing for explaining, as an example, that a target page to be written most recently is an MSB page.

The processor 110 may determine the LSB data stored in the LSB page of the third word line WL3, as the special management data. The processor 110 may back up the special management data by selecting the backup pages in response to the number of empty pages corresponding to incomplete word lines, that is, 3 backup pages. The backup pages may be 3 pages which are selected subsequently to the MSB page of the first word line WL1 written most recently, according to the write order.

Figure 12:
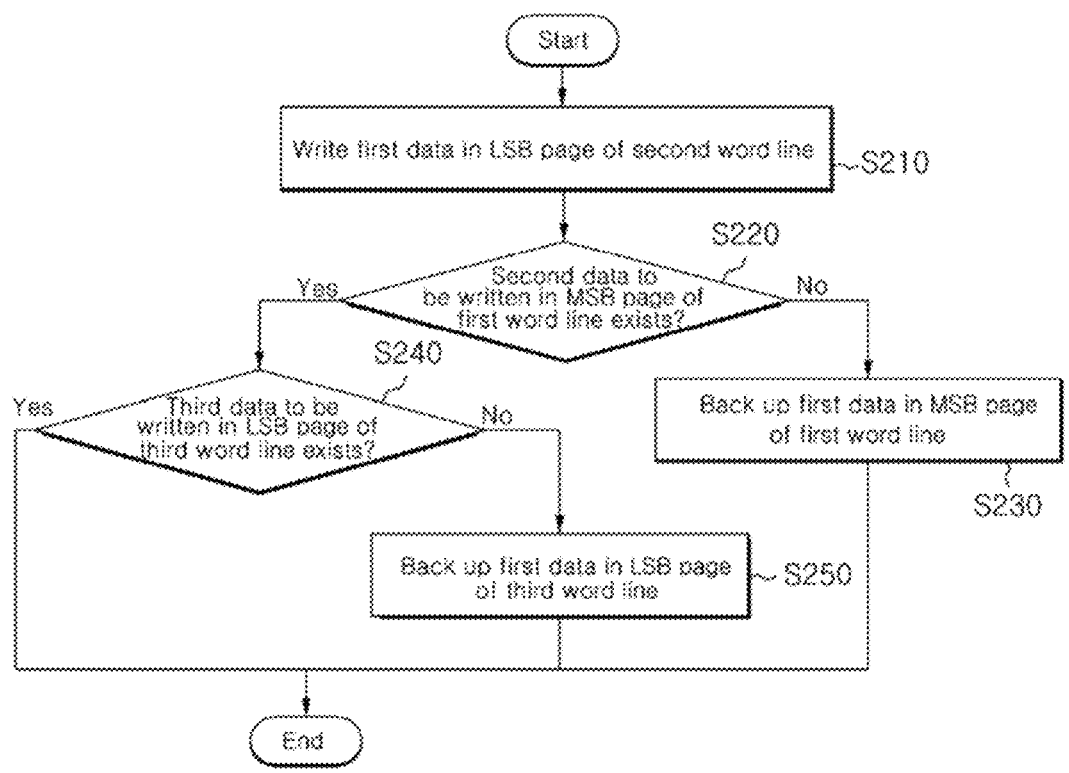
FIG. 12 is a flow chart explaining an operating method of a data storage device in accordance with an embodiment of the present invention.

FIG. 12 is a flow chart explaining an operating method of a data storage device in accordance with an embodiment of the present invention. In FIG. 12, it is assumed that the data storage device includes first to third word lines which are sequentially disposed each of the first to third word lines corresponds to an LSB page and an MSB page, and a write operation is performed according to the write order described above with reference to FIG. 6A.

Referring to FIG. 12, at step S210, the data storage device may write first data in the LSB page of the second word line in response to a write request.

At step S220, it is determined whether there is second data to be written in the MSB page of the first word line in response to the corresponding write request. When there is no second data (No), the process may proceed to step S230. When there is second data (Yes), the process may proceed to step S240.

At step S230, the data storage device may back up the first data in the MSB page of the first word line.

At step S240, it is determined whether there is third data to be written in the LSB page of the third word line in response to the corresponding write request. When there is no third data (No), the process may proceed to step S250. When there is third data (Yes), the process may end.

At step S250, the data storage device may back up the first data in the LSB page of the third word line.

While various embodiments have been described above, it will be understood to those skilled in the art that the embodiments described are examples only. Accordingly, the data storage device and the operating method thereof described herein should not be limited based on the described embodiments.

What is claimed is:
1. A data storage device comprising:
a nonvolatile memory apparatus including a memory block including a plurality of pages; and
a processor suitable for writing write data in target pages selected from the plurality of pages according to a write order, selecting data stored in a least significant bit page, which is written most recently among the target pages, as special management data, selecting a first number of backup pages among the plurality of pages, wherein the first number is a number of empty pages corresponding to one or more incomplete word lines in each of which some pages are used for storing data and the remaining pages are empty in the memory block, and backing up the special management data in the backup pages.

2. The data storage device according to claim 1, wherein the processor determines the backup pages by selecting pages that are to be written subsequently to the target pages, from the plurality of pages, according to the write order.

3. The data storage device according to claim 2, wherein the write order is set to minimize interference effects induced among the plurality of pages.

4. The data storage device according to claim 1, wherein the processor receives a write request for the write data, from an external device, and reports a completion of a write operation to the external device when the special management data is backed up.

5. An operating method of a data storage device, comprising:
   writing write data in target pages selected from a plurality of pages in a memory block according to a write order;
   selecting data stored in a least significant bit page, which is written most recently among the target pages, as special management data;
   selecting a first number of backup pages among the plurality of pages, wherein the first number is a number of empty pages corresponding to one or more incomplete word lines in each of which some pages are used for storing data and the remaining pages are empty in the memory block; and
   backing up the special management data in the backup pages.

6. The operating method according to claim 5, wherein, the backing-up of the special management data comprises:
   reading the special management data from the least significant bit page; and
   writing the read special management data in the backup pages.

7. The operating method according to claim 5, wherein, before the writing of the write data, the operating method further comprises:
   receiving a write request for the write data, from an external device,
   wherein, after the backing-up of the special management data, a completion of a write operation is reported to the external device.

8. The operating method according to claim 5, wherein the backup pages are selected subsequently to the target pages according to the write order.

9. An operating method of a data storage device, comprising:
   writing write data in target pages selected from a plurality of pages in a memory block according to a write order;
   selecting data stored in a page, which is written most recently among the target pages, as first special management data;
   selecting data stored in a least significant bit page, which is written most recently among the target pages, as second special management data;
   selecting a first number of first backup pages among the plurality of pages, wherein the first number is a number of empty pages corresponding to one or more incomplete word lines in each of which some pages are used for storing data and the remaining pages are empty in the memory block;
   selecting a second backup page among the plurality of pages; and
   backing up the first special management data in the first backup pages and backing up the second special management data in the second backup page.

10. The operating method according to claim 9, wherein, the backing-up of the first special management data and the second special management data comprises:
    reading the first special management data and the second special management data from the page and the least significant bit page, respectively; and
    writing the read first special management data and the read second special management data in the first backup pages and the second backup page, respectively.

11. The operating method according to claim 9, wherein, before the writing of the write data, the operating method further comprises:
    receiving a write request for the write data, from an external device,
    wherein, after the backing-up of the first special management data and the second special management data, a completion of a write operation is reported to the external device.

12. The operating method according to claim 9, wherein the first backup pages are selected subsequently to the target pages according to the write order and the second backup page is selected subsequently to the first backup pages according to the write order.

* * * * *